(12) United States Patent
Yang

(10) Patent No.: US 8,497,787 B2
(45) Date of Patent: Jul. 30, 2013

(54) SYSTEMS AND METHODS FOR PERFORMING EFFICIENT DECODING USING A HYBRID DECODER

(75) Inventor: Xueshi Yang, Cupertino, CA (US)

(73) Assignee: Marvell World Trade Ltd., St. Michael (BB)

(\*) Notice: Subject to any disclaimer, the term of this patent is extended or adjusted under 35 U.S.C. 154(b) by 99 days.

(21) Appl. No.: 13/290,672

(22) Filed: Nov. 7, 2011

(65) Prior Publication Data

US 2012/0119928 A1     May 17, 2012

Related U.S. Application Data

(60) Provisional application No. 61/413,246, filed on Nov. 12, 2010.

(51) Int. Cl.
*H03M 7/40* (2006.01)

(52) U.S. Cl.
USPC .............. 341/67; 455/307; 455/70; 341/51; 341/55; 341/94; 382/253; 370/468; 375/350; 375/265; 375/259; 375/332; 375/229; 714/755; 714/795; 714/782

(58) Field of Classification Search
USPC . 341/51–70; 382/253; 455/70, 307; 375/350, 375/265, 262, 259, 341, 332, 260, 229; 714/755, 714/752, 795, 780, 792, 782
See application file for complete search history.

(56) References Cited

U.S. PATENT DOCUMENTS

| | | | | |
|---|---|---|---|---|
| 4,821,290 A * | 4/1989 | Hingorani et al. | ............. | 375/242 |
| 5,381,145 A * | 1/1995 | Allen et al. | .................... | 341/107 |
| 5,583,500 A * | 12/1996 | Allen et al. | .................... | 341/107 |
| 6,418,147 B1 * | 7/2002 | Wiedeman | ..................... | 370/468 |
| 7,827,450 B1 * | 11/2010 | Yang et al. | ..................... | 714/704 |
| 8,207,878 B2 * | 6/2012 | Brekelmans et al. | ......... | 341/110 |

\* cited by examiner

*Primary Examiner* — Lam T Mai

(57) ABSTRACT

Systems and methods for decoding data using a hybrid decoder are provided. A data signal that includes a codeword is received. A signal quality indicator for the data signal is computed. One of a plurality of decoders is selected based on the computed signal quality indicator. Each of the plurality of decoders is configured to decode information based on a different decoding technique. The codeword included in the data signal is decoded using the selected one of the plurality of decoders.

20 Claims, 3 Drawing Sheets

SYSTEMS AND METHODS FOR PERFORMING EFFICIENT DECODING USING A HYBRID DECODER

CROSS REFERENCE TO RELATED APPLICATION

This disclosure claims the benefit of U.S. Provisional Application. No. 61/413,246, filed Nov. 12, 2010, which is hereby incorporated by reference herein in its entirety.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, is neither expressly nor impliedly admitted as prior art against the present disclosure.

Data error rates in traditional flash memory devices depend on the duration of time the data is retained in the memory as well as the number of program-erase (PE) cycles of the page where the data resides and many other factors. Traditional systems use error correction code circuitries (FCC) and decoding engines to detect/correct data errors encountered when reading the data from the flash memory devices. In addition, because the amount of: errors in the data (i.e., bit error rate or signal to noise ratio) could vary widely between different data sets that are read from memory, the type of decoding engine that is needed to decode a given data set is unknown when the data is read.

To address these uncertainties, traditional systems first attempt to decode the data with the least complex decoding technique (i.e., a technique based on hard decisions). If the least complex decoding technique decodes the data unsuccessfully, these systems then attempt to decode the same data with a more complex decoding technique (i.e., using more iterations than the less complex decoding technique). Although the data in these systems is eventually successfully decoded, the decoding process typically requires many decoding attempts to decode one data set and therefore lacks efficiency (i.e., wastes resources, consumes a large amount of power and increases decoding latency by taking more time to decode).

SUMMARY

Systems and methods are provided for performing efficient decoding using a hybrid decoder. In particular, a received codeword is analyzed before attempting to decode the codeword and an optimal decoder is selected based on the codeword analysis.

In some embodiments, a data signal that includes a codeword is received. A syndrome for the data signal is computed. One of a plurality of decoders is selected based on the computed syndrome. Each of the plurality of decoders is configured to decode information based on a different decoding technique. The codeword included in the data signal is decoded using the selected one of the plurality of decoders. In some implementations, the data signal is retrieved from an electronic storage device. In some implementations, a first of the plurality of decoders is configured to decode information using a number of iterations greater than a second of the plurality of decoders. In some implementations, a first of the plurality of decoders shares decoding circuitry with a second of the plurality of decoders.

In some embodiments, the computed syndrome represents signal quality of the data signal in terms of a signal to noise ratio (SNP) of the data signal or bit error rate. In some implementations, the signal quality is measured based on a number of errors in a pilot signal corresponding to the codeword. In some implementations, the signal quality is measured based on a number of erasures performed in an electronic storage device in which the codeword is stored or on the time passed since the data was programmed.

In some implementations, a determination is made as to whether a value of the syndrome exceeds a predetermined threshold. The one of the plurality of decoders that is selected is a first of the plurality of decoders when the value is determined to exceed the predetermined threshold. The one of the plurality of decoders that is selected is a second of the plurality of decoders when the value is determined to equal or be less than the predetermined threshold.

In some embodiments, a determination is made as to whether the codeword was decoded successfully with the selected one of the plurality of decoders. A second one of the plurality of decoders is selected that is different from the selected one of the plurality of decoders when the codeword is determined to not have been successfully decoded with the selected one of the plurality of decoders. The codeword included in the data signal is decoded using the selected second one of the plurality of decoders.

In some embodiments, the data signal that includes the codeword and a control signal are received with a multiplexer. The multiplexer includes a plurality of outputs each coupled to a respective one of the plurality of decoders. The data signal is coupled, based on the control signal, to one of the plurality of outputs of the multiplexer that is coupled to the selected one of the plurality of decoders.

BRIEF DESCRIPTION OF THE DRAWINGS

The above and other objects and advantages of the present disclosure will be apparent upon consideration of the following detailed description, taken in conjunction with the accompanying drawings, in which like reference characters refer to like parts throughout, and in which.

DETAILED DESCRIPTION

This disclosure generally relates to performing efficient decoding using a hybrid decoder. For illustrative purposes, this disclosure is described in the context of an electronic storage system where the storage used is a flash memory device. However, it should be understood that the teachings of this disclosure are equally applicable to any other electronic storage system where the data that is written to the storage system is prone to reading errors (e.g., random access memory devices, programmable logic devices, non-volatile memory, volatile memory, FeRAM, CBRAM, PRAM, SONGS, RRAM, Racetrack memory, NRAM and Millipede storage devices).

Figure 1:
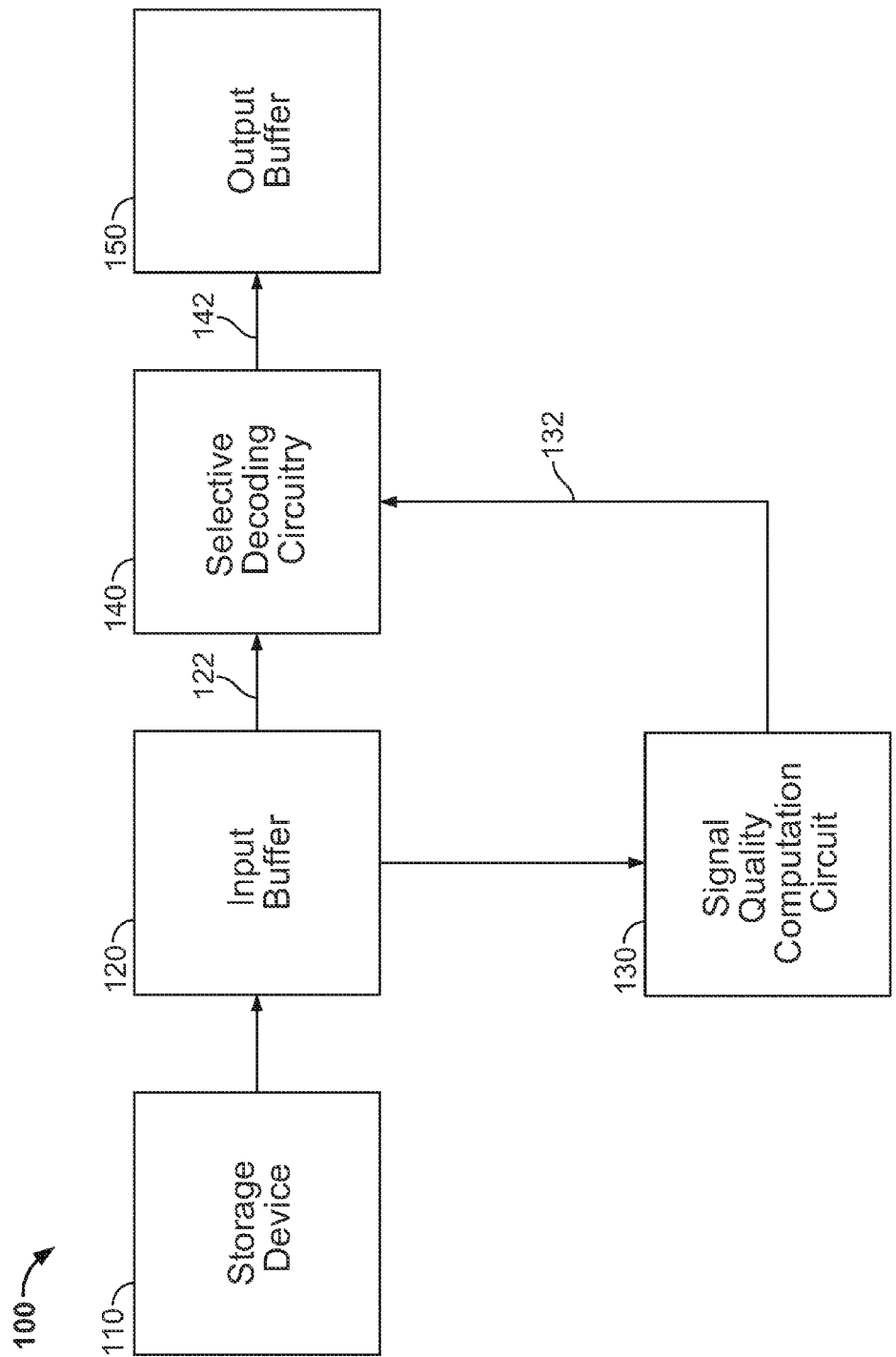
FIG. 1 shows an illustrative hybrid decoder system in accordance with some embodiments of the present disclosure.

FIG. 1 shows an illustrative hybrid decoder system 100 in accordance with some embodiments of the present disclosure. Hybrid decoder system 100 includes a storage device 110, an input buffer 120, a signal quality computation circuit 130, selective decoding circuitry 140 and an output buffer 150. Storage device 110 may include an electronic storage device (e.g., flash memory device, random access memory devices, programmable logic devices, non-volatile memory, volatile memory, FeRAM, CBRAM, PRAM, SONGS, RRAM, Racetrack memory, and/or NRAM and Millipede storage devices).

The data stored in storage device 110 may be encoded and may thereby include a codeword. Coded information can be grouped into units called "codewords." Codewords may contain "symbols," which are groupings of one or more bits. Storing the data in encoded form increases reliability in data that is stored in electronic memory. Once the codeword is retrieved from the memory, the codeword needs to be decoded to output the set of information represented by the codeword.

In some embodiments, a control circuit (not shown) may instruct storage device 110 to output data stored at a given address location. For example, the control circuit may instruct storage device 110 to retrieve a page of data. The codeword stored at the given address (or addresses) (e.g., the page of coded data is output by storage device 110 and stored in input butter 120. Input buffer 120 may be a temporary storage location in which a given set of coded information (e.g., a codeword) that is retrieved from memory is stored prior to being decoded.

Signal quality computation circuit 130 may read the codeword stored in input buffer 120. Signal quality computation circuit 130 may process the codeword to determine a signal quality level of the data read from storage device 110. For example, signal quality computation circuit 130 may compute a signal to noise ratio (SNP) of the codeword stored. In input buffer 120 as the signal quality level. In some implementations, signal quality computation circuit 130 may compute a raw bit error rate (PER) of the codeword stored in input buffer 120 as the signal quality level. In some implementations, signal quality computation circuit 130 may compute how many errors exist in the pilot data of the codeword stored in input buffer 120 as the signal quality level. Systems and methods for computing a number of errors that exist in pilot data are described in more detail in commonly-owned U.S. patent application Ser. No. 12/052,350, filed Mar. 20, 2008 (now U.S. Pat. No. 7,827,450), which is hereby incorporated by reference herein in its entirety. Signal quality computation circuit 130 may perform any one of these techniques or may combine these techniques to determine the signal quality level of the codeword stored in input buffer 120.

In some implementations, signal quality computation circuit 130 may compute how many erasures (or PE cycles) have been performed in the storage location of storage device 110 from which the codeword stored in input buffer 120 is read as the signal quality level. For example, input buffer 120 may include a separate field in which additional information associated with the read data is stored. The additional information may the number of times the page or storage location of the codeword was erased or any other information that is indicative of or that can be used to determine a signal quality level, as discussed above. In some implementations, based on the data contained in this field of input buffer 120, signal quality computation circuit 130 may determine how many times the storage location or page in which the codeword is stored was erased and use that information as the signal quality level of the codeword in input buffer 120. Signal quality computation circuit 130 may output signal 132 representing the computed signal quality level to selective decoding circuitry 140.

Selective decoding circuitry 140 may receive the codeword 122 stored in input buffer 120 and the computed signal quality level from signal 132. Selective decoding circuitry 140 selects one of a plurality of decoders based on the computed signal quality level of the codeword. In particular, selective decoding circuitry 140 may include a plurality of decoders each configured to decode data using a different decoding technique. Selective decoding circuitry 140 determines which of the decoders is most suitable to decode the codeword in the most efficient manner (e.g., with the least number of iterations, using the least amount of power, etc.) successfully. For example, a first codeword that has signal quality level that is computed to be worse than a second codeword may require a stronger, more complex, more time consuming, and more power consumptive decoder (e.g., a decoder that decodes based on a soft input and uses multiple iterations) to be successfully decoded than a decoder needed to decode the second codeword (e.g., a decoder that decodes based on a hard input). In some implementations, selective decoding circuitry 140 may be coupled to storage device 110 and may be configured to retrieve additional soft input associated with the codeword stored in input buffer 120 when certain decoders (e.g., decoders that operate using a soft input rather than a hard input) are selected to decode the codeword.

Selective decoding circuitry 140 may determine whether the codeword stored in input buffer 120 was decoded by the selected decoder successfully. When selective decoding circuitry 140 successfully decodes the codeword using the selected decoder, selective decoding circuitry 140 may output the decoded data 142 to output buffer 150. Output buffer 150 may be a temporary storage location in which a decoded data set is stored for consumption by utilization circuitry (e.g., a processor or control circuitry). In some implementations, when selective decoding circuitry 140 unsuccessfully decodes the codeword using the selected decoder, selective decoding circuitry 140 may select a more powerful and/or complex decoder to decode the same codeword. When the newly selected decoder successfully decodes the codeword, decoded data 142 may be output and stored in output buffer 150.

Figure 2:
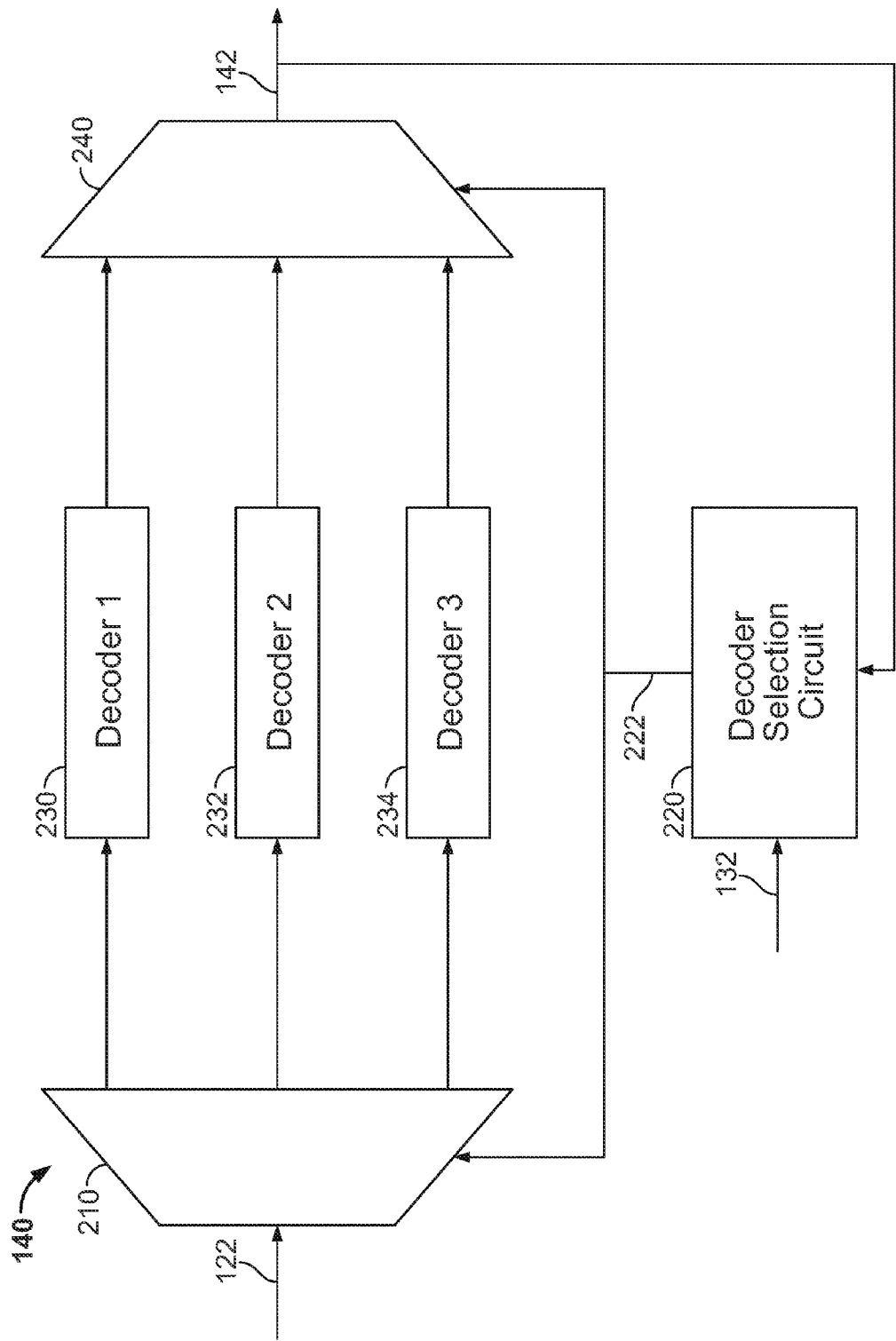
FIG. 2 shows an illustrative selective decoder circuitry in accordance with some embodiments of the present disclosure.

FIG. 2 shows an illustrative selective decoder circuitry 140 in accordance with some embodiments of the present disclosure. Selective decoder circuitry 140 may a first selection circuit 210, a second selection circuit 240, decoder circuits 230, 232 and 234 and decoder selection circuit 220. Although only three decoder circuits 230, 232 and 234 are shown and described in connection with FIG. 2, selective decoder circuitry 140 may include any number of additional or less decoder circuits.

Each decoder circuit 230, 232 and 234 may be configured to decode data using a different decoding technique. In some implementations, decoder circuit 230 may be configured to decode data using a decoding technique that is the less powerful than the other decoders 232 and 234. In particular, decoder circuit 230 may be a decoder that decodes data based on a hard input. Decoder circuit 232 may be more complex than decoder circuit 230 but less complex than decoder circuit 234. Each of decoders 732 and 234 may decode data based on a soft input. More specifically, decoder circuit 230 may include a hard detector and decoder circuits 232 and 234 may include soft detectors. The hard detector may receive a sequence of bits from input buffer 120 and output hard decision data. These hard decisions consist of data corresponding to the original encoded data symbols stored in storage device 110. Hard decision decoder circuit of decoder circuit 230 can then receive the hard decision data as input, and output decoded data symbols. On the other hand, soft detectors may receive, a sequence of bits from an input, buffer 120 and output soft data. These soft data consist of data that indicate the probability that the received encoded data are a particular data symbol, such as "0" or "1" in a binary system. Soft decision decoder of the decoder circuits 232 and 234 can then receive the soft data as input, and output decoded data symbols. The difference between the decoder circuit 232 and 234 may be the number of iterations performed to decode the data. The decoder circuit that decodes the codeword with a greater number of iterations may be considered to be more complex and more powerful than the other.

In some embodiments, decoder circuitry 230 may implement a linear decoding process to decode the codeword, decoder circuitry 232 may implement an iterative decoding process to decode the codeword and decoder circuitry 234 may implement a turbo decoding process to decode the codeword. It should be understood that decoders 230, 232 and 234 of selective decoder circuitry 140 may implement any suitable decoding process or technique that is different from one another. For example, when low density parity check (LDPC) code is used, decoder 230 can be a hard decision decoder (e.g., Gallader decoder), decoder 231 can be a min-sum decoder with two iterations, and decoder 234 can be a sum-product decoder with twenty iterations.

In some embodiments, each decoder circuit 230, 232 and 234 may include or be coupled to a corresponding error correction circuit that outputs error corrected data to the corresponding decoder.

In some embodiments, decoder selection circuit 220 may compute a syndrome or syndrome weight based on the computed or determined signal quality level (e.g., number of: PE cycles, REP, SNR, etc.) of the codeword stored in input buffer 120 received from signal 132. The syndrome or syndrome weight may be a value, symbol or number that is used to select a type of decoder to decode the codeword stored in input buffer 120. In some implementations, the syndrome may be an integer number which is proportional (or inversely proportional) to the codeword length and/or bit error rate. The syndrome range may be assigned by type (e.g., type A representing syndrome weights between 0 and 100, type P representing syndrome weights between 100 and 400, and type C representing syndrome weights 400 and above). Accordingly, the type (or size) of the syndrome may correspond to the number of decoders in hybrid decoding system 100 available to decode the codeword stored in input buffer 120. For example, when hybrid decoding system 100 includes three decoder circuits 230, 232 and 234, the type (or size) of the syndrome produced by decoder selection circuit 220 may be three (e.g., the type of syndrome may be 2 bits wide). In some implementations, the type (or size) of the syndrome may be determined in accordance with the ceiling ($\log_2 N$), where N is the number of decoder circuits 230, 232, 234 available in hybrid decoding system 100.

In some embodiments, a higher value or number represented by the syndrome may cause a stronger or more complex decoder circuit to be used to decode received codeword 122. In some embodiments, a lower value or number represented by the syndrome may cause a weaker or less complex decoder circuit to be used to decode received codeword 122. In some implementations, decoder selection circuit 220 may output the value representing the syndrome as a control signal 222 to first and second selection circuits 210 and 240.

In some embodiments, decoder selection circuit 220 may assign a syndrome value, symbol or number to the computed signal quality level by comparing the computed signal quality level to a predetermined threshold. The number of thresholds may correspond to the number of decoders in selective decoding circuitry 140 available to decode codeword 122. For example, when selective decoding circuitry 140 includes three decoder circuits 230, 232 and 234, the number of predetermined thresholds may be two. In particular, the number of threshold values may be equal to N−1, where N is the number of available decoder circuits in selective decoding circuitry 140.

In some embodiments, when two predetermined thresholds are used and when selective decoding circuitry 140 includes three decoders 230, 232 and 234, decoder selection circuit 220 may compare received signal quality level 132 with a first of the two predetermined thresholds which corresponds to the lower predetermined threshold. When the signal quality level 132 is lower than the first predetermined threshold, decoder selection circuit 220 may assign a syndrome type value that corresponds to the least complex decoder circuit (e.g., decoder circuit 230). More specifically, decoder selection circuit 220 may generate a syndrome type value that causes decoder 230 to be selected to decode codeword 122. When the signal quality level 132 is higher than the first predetermined threshold, decoder selection circuit 220 may compare the signal quality level 132 to the second predetermined threshold. When the signal quality level 132 is higher than the first predetermined threshold but lower than the second predetermined threshold, decoder selection circuit 220 may assign a syndrome type value that corresponds to decoder circuit 232. More specifically, decoder selection circuit 220 may generate a syndrome type value that causes decoder 232 to be selected to decode codeword 122. When the signal quality level 132 is higher than the first predetermined threshold and higher than the second predetermined threshold, decoder selection circuit 220 may assign a syndrome value that corresponds to decoder circuit 234 (e.g., the most complex decoder circuit). More specifically, decoder selection circuit 720 may generate a syndrome type value that causes decoder 234 to be selected to decode codeword 122.

In some implementations, when decoder selection circuit 220 generates a syndrome that causes a decoder that requires soft input information, selection circuit 220 may retrieve from storage device 110 the necessary soft input information associated with codeword 122. More specifically, more complex decoder circuits 232 and 234 may require additional data to be relieved from storage device 110 to successfully decode codeword 122.

In some embodiments, the predetermined threshold values may be set based on the desired power consumption and latency of a given application. For example, in a system with two predetermined threshold values, setting the first lower threshold to a lower value and the second higher threshold to a higher value may result in greater use of the more complex decoder circuits 232 and 234 but less unsuccessful decoding operations. In particular, the lower the value that is set for the first lower threshold, the more likely that the syndrome generated by decoder selection circuit 220 will correspond to the second or third decoder circuits 232 and 234. In addition, the lower the value that is set for the second higher threshold, the more likely that the syndrome generated by decoder selection circuit 220 will correspond to third decoder circuit 234 rather than second decoder circuits 232. Setting appropriate values for the thresholds may require balancing the need for more frequent use of more complex decoders 232 and 234 with the cost of more latency incurred in the decoding process and more power being consumed.

Decoder selection circuit 220 may be configured to automatically adjust (dynamically adjust) the values of the thresholds (e.g., increase or decrease one or both threshold values) based on a number of previous successful or unsuccessful decoding attempts with a set of codewords or any other suitable criteria. For example, decoder selection circuit 220 may store a count representing how many times codewords were unsuccessfully decoded with first decoder circuit 230 during a predetermined period (e.g., for the previous 100 codewords 122 that were received). When the number of times codewords were unsuccessfully decoded with first decoder circuit 230 exceeds a predetermined value (e.g., 20), decoder selection circuit 220 may decrease the value of the first lower threshold to cause second decoder 232 to be selected to decode a received codeword 122 more frequently. Similarly, decoder selection circuit 220 may store a count representing how many times codewords were unsuccessfully decoded with second decoder circuit 232 during a predetermined period (e.g., for the previous 100 codewords 122 that were received). When the number of times codewords were unsuccessfully decoded with second decoder circuit 232 exceeds a predetermined value (e.g., 10) decoder selection circuit 220 may decrease the value of the second higher threshold to cause third decoder 234 to be selected to decode a received codeword 122 more frequently than first and second decoder circuits 230 and 232.

In some implementations, decoder selection circuit 220 may store a count representing how many times codewords were successfully decoded with first decoder circuit 230 during a predetermined period (e.g., for the previous 100 codewords 122 that were received). When the number of times codewords were successfully decoded with first decoder circuit 230 exceeds a predetermined value (e.g., 50), decoder selection circuit 220 may increase the value of the first lower threshold to cause first decoder 230 to be selected to decode a received codeword 122 more frequently than second and third decoder circuits 232 and 234. Similarly, decoder selection circuit 220 may store a count representing how many times codewords were successfully decoded with second decoder circuit 232 during a predetermined period (e.g., for the previous 100 codewords 122 that were received). When the number of times codewords were successfully decoded with second decoder circuit 232 exceeds a predetermined value (e.g., 10), decoder selection circuit 220 may increase the value of the second higher threshold to cause second decoder 232 to be selected to decode a received codeword 122 more frequently than third decoder circuit 234.

In some embodiments, first selection circuit 210 may be a demultiplexer and second selection circuit 240 may be a multiplexer. First selection circuit 210 may receive a data input codeword 122 and as control input control signal 222 output by decoder selection circuit 220. Codeword 122 may include the originally-read encoded data from storage device 110 and/or any additional information (e.g., soft input information) associated with the originally-read encoded data read from storage device 110 subsequent to or concurrently with the originally-read encoded data. For example, decoder selection circuit 220 may determine a need for additional decoding data to be retrieved when a syndrome corresponding to a decoder circuit that operates with soft inputs is generated. In response, decoder selection circuit 220 may retrieve the additional information associated with the codeword stored in input buffer 120 and cause input buffer 120 to provide that additional information with the codeword as signal 122.

First selection circuit 210 may include a number of outputs that corresponds to or is equal to the number of available decoder circuits in selective decoding circuitry 140 (e.g., three decoder circuits 230, 232 and 234). Each output of first selection circuit 210 may be coupled to a respective one of the available decoder circuits. For example, first selection circuitry 210 may include three outputs coupled respectively to decoder circuits 230, 232 and 234.

First selection circuit 210 may couple the data input (e.g., codeword 122) to one of decoder circuits 230, 232 and 234 exclusively of the other decoder circuits 230, 232 and 234 based on the value received from control signal 222. For example, first selection circuit 210 may receive as control signal 222 a syndrome value corresponding to decoder circuit 232. In response to receiving that control signal 222, first selection circuit 210 may couple or send the data input codeword 122 to decoder circuit 232. The remaining outputs of first selection circuit 210 (e.g., the outputs of first selection circuit 210 coupled to decoder circuits 230 and 234) may be placed into tri-state mode. In some embodiments, first selection circuit 210 may next receive as control signal 222 a syndrome value corresponding to decoder circuit 234 (e.g., when decoder selection circuit 220 determines that decoder circuit 232 failed to successfully decode codeword 122). In response to receiving that control signal 222, first selection circuit 210 may couple or send the data input codeword 122 to decoder circuit 234. The remaining outputs of first selection circuit 210 (e.g., the outputs of first selection circuit 210 coupled to decoder circuits 230 and 232) may be placed into tri-state mode. Alternatively or in addition, any one of decoder circuits 230, 232 and 234 that is not selected by control signal 222 to decode codeword 122 may be used by a processor or other circuitry to decode other data.

In some embodiments, second selection circuit 240 may receive as data inputs, outputs from respective available decoder circuits of selective decoding circuitry 140, and as control input, control signal 222 output by decoder selection circuit 220. In particular, second selection circuit 240 may include a number of data inputs that correspond to or are equal to the number of available decoder circuits. The number of data inputs included in second selection circuit 240 may be the same as the number of outputs included in first selection circuit 210. For example, second selection circuit 240 may be coupled to receive outputs respectively from decoder circuits 730, 232 and 234.

Second selection circuit 240 may be controlled by control signal 222 to couple an output from one of the decoder circuits selected by decoder selection circuit 220 to output 142. For example, decoder selection circuit 132 may provide as control signal 222 a value that causes first selection circuit 210 to output codeword 122 to decoder circuit 232. The same or different control signal 222 may be provided to second selection circuit 240 and cause second selection circuit 240 to couple an output of decoder circuit 232, received as one of the inputs to selection circuit 240 to output 142. More specifically, second selection circuit 240 may couple one of the inputs of second selection circuit 240 corresponding to a selected one of the decoder circuits to output 142.

In some embodiments, output 142 may include the decoded information provided by the selected decoder circuit. Output 142 may include a control signal indicating whether codeword 122 was successfully decoded or whether the selected decoder circuit failed to decode codeword 122. Output 142 may be coupled to decoder selection circuit 220. Decoder selection circuit 220 may process output 142 to determine whether the selected decoder successfully decoded codeword 122.

In response to determining that the selected decoder successfully decoded codeword 122, decoder selection circuit 220 may store output 142 to output buffer 150 and/or may store an indication that the decoding operation succeeded. In some implementations, decoder selection circuit 220 may increment a counter corresponding to the selected decoder circuit (e.g., decoder circuit 232) indicating the number of times the selected decoder successfully decoded codeword 122.

In response to determining that the selected decoder failed to successfully decode codeword 12, decoder selection circuit 220 may clear output 142 and/or may store an indication that the decoding operation failed. In some implementations, decoder selection circuit 220 may increment a counter (or decrement a counter) corresponding to the selected decoder circuit (e.g., decoder circuit 232) indicating the number of times the selected decoder unsuccessfully decoded codeword 122. Decoder selection circuit 220 may generate a new syndrome corresponding to a decoding circuit that is more complex than the previously selected decoder circuit. For example, a previously generated syndrome may correspond to decoder circuit 232. In response to determining decoder circuit 232 failed to decode codeword 122 successfully, decoder selection circuit 220 may generate a decoder selection signal that corresponds to decoder circuit 234 which may be more complex and/or more powerful than decoder circuit 232. Decoder selection circuit 220 may output a new control signal 222 to first and second selection circuits 210 and 240 to cause the newly selected decoder circuit (e.g., decoder circuit 234) to decode codeword 122.

In some embodiments, instead of generating a new selection that corresponds to a decoder circuit next in the sequence of decoder circuits in terms of complexity when a given decoder circuit fails to decode codeword 122, decoder selection circuit 220 may always generate a selection signal corresponding to the most complex decoder circuit available in selective decoding circuitry 140 in response to determining that a selected decoder circuit failed to decode codeword 122. For example, initially, decoder selection circuit 220 may generate a syndrome that causes first selection circuit 210 to select decoder circuit 230 to decode codeword 122. Decoder selection circuit 220 may determine that the selected decoder circuit 230 failed to successfully decode codeword 122. In response, decoder selection circuit 220 may generate a new selection signal that causes first selection circuit 210 to select decoder circuit 234 (e.g., the decoder circuit that decodes a codeword based on a decoding technique that is more complex that the other available decoder circuits 230 and 232) to decode codeword 122. Upon determining that the newly selected decoder circuit 234 successfully decoded codeword 122, decoder selection circuit 220 may store the decoded information. In output buffer 150.

Figure 3:
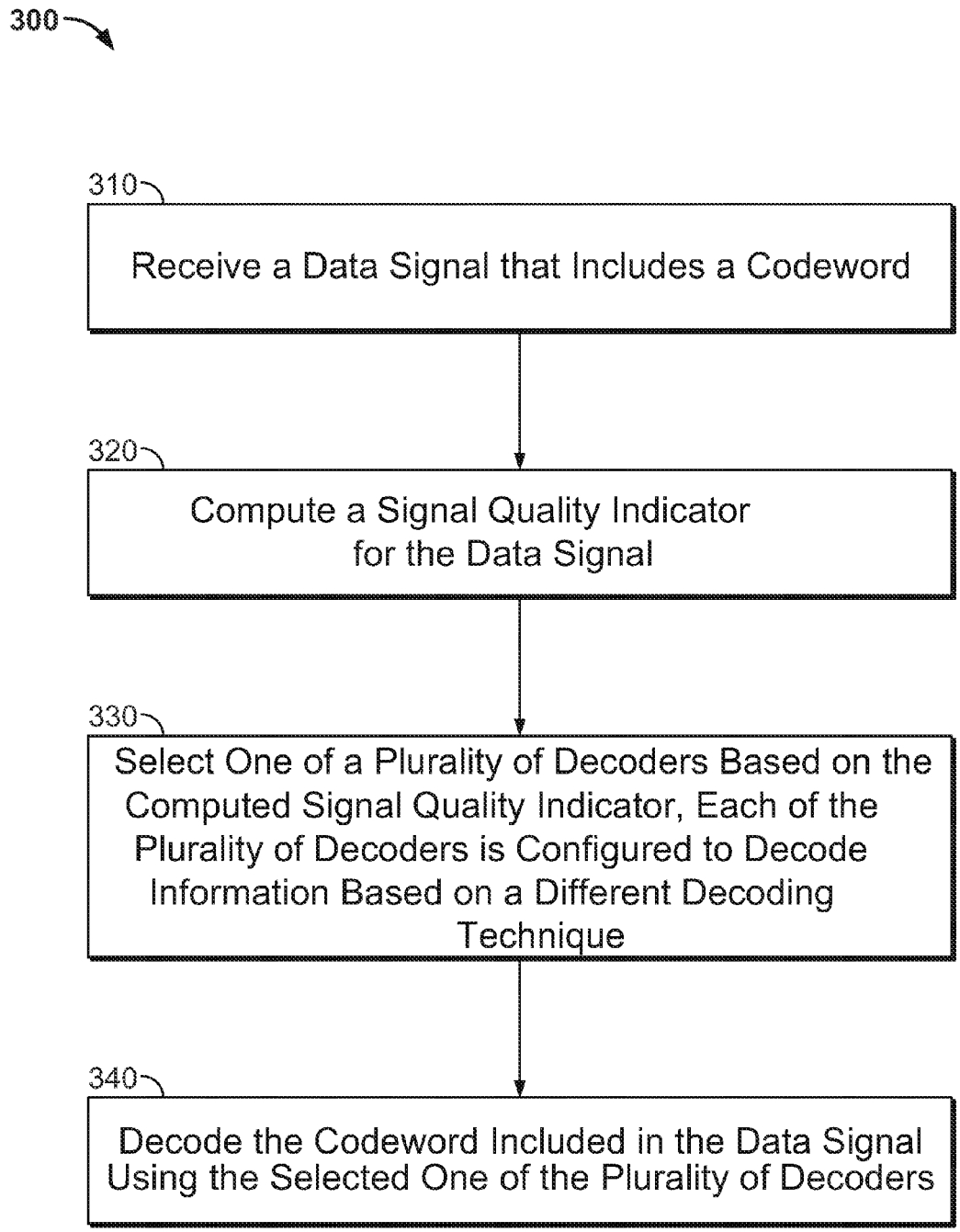
FIG. 3 shows an illustrative flow diagram of a process for decoding data with a hybrid decoder in accordance with some embodiments of the present disclosure.

FIG. 3 shows an illustrative flow diagram 300 of a process for decoding data with a hybrid decoder in accordance with some embodiments of the present disclosure. At 310, a data signal that includes a codeword is received. For example, a codeword may be retrieved from a storage location in storage device 110 and stored in input buffer 120.

At 320, a syndrome for the data signal is computed. For example, signal quality computation circuit 130 may analyze the signal quality of the codeword stored in input buffer 120 and provide a signal representing the signal quality to decoder selection circuit 220. Decoder selection circuit 220 may generate a syndrome by, for example, comparing the signal quality of the codeword to one or more predetermined thresholds.

At 330, one of a plurality of decoders is selected based on the computed syndrome. Each of the plurality of decoders is configured to decode information based on a different decoding technique. For example, decoder selection circuit 220 may output control signal 222 representing the computed syndrome that causes first selection circuit 210 to output codeword 122 to one of decoder circuits 230, 232 or 234 identified by control signal 222.

At 340, the codeword included in the data signal is decoded using the selected one of the plurality of decoders.

The foregoing describes systems and methods for decoding data with a hybrid decoder. Those skilled in the art will appreciate that the described embodiments of the present disclosure may be practiced by other than the described embodiments, which are presented for the purposes of illustration rather than of limitation.

Furthermore, the present disclosure is not limited to a particular implementation. For example, one or more steps of methods described above may be performed in a different order (or concurrently) and still achieve desirable results. In addition, the disclosure may be implemented in hardware, such as on an application-specific integrated circuit (ASIC) or on a field-programmable gate array (FPGA), both of which may include additional communication circuitry (e.g., radio-frequency circuitry). Alternatively, the present disclosure may also be implemented in software running on any suitable hardware processor. Accordingly, equivalents may be employed and substitutions made, where appropriate, by those skilled in the art herein without departing from the scope of the present disclosure as recited in the claims that follow.

What is claimed is:

1. A method comprising:
  receiving a data signal that includes a codeword;
  computing a signal quality indicator for the data signal;
  selecting one of a plurality of decoders based on the computed signal quality indicator, wherein each of the plurality of decoders is configured to decode information based on a different decoding technique; and
  decoding the codeword included in the data signal using the selected one of the plurality of decoders.

2. The method of claim 1, wherein the signal quality indicator is a syndrome weight of the received codeword.

3. The method of claim 1, wherein the computed signal quality indicator represents the signal to noise ratio (SNR) of the data signal or raw bit error rate.

4. The method of claim 1 further comprising:
  determining whether a value of the signal quality indicator exceeds a predetermined threshold; wherein:
  the one of the plurality of decoders that is selected is a first of the plurality of decoders when the value is determined to exceed the predetermined threshold; and
  the one of the plurality of decoders that is selected is a second of the plurality of decoders when the value is determined to be equal or less than the predetermined threshold.

5. The method of claim 1 further comprising:
  determining whether the codeword was decoded successfully with the selected one of the plurality of decoders;
  selecting a second one of the plurality of decoders different from the selected one of the plurality of decoders when the codeword is determined to not have been decoded with the selected one of the plurality of decoders; and
  decoding the codeword included in the data signal using the selected second one of the plurality of decoders.

6. The method of claim 1, wherein a first of the plurality of decoders is configured to decode information using a number of iterations less than a second of the plurality of decoders.

7. The method of claim 1, wherein the signal quality is computed based on a number of errors in a pilot signal corresponding to the codeword.

8. The method of claim 1, wherein the signal quality indicator is computed based on a number of program erase cycles performed in an electronic storage device in which the codeword is stored or the time passed since the data signal has been programmed in the electronic storage device.

9. The method of claim 1, wherein the selecting comprises:
receiving the data signal that includes the codeword and a control signal with a demultiplexer, wherein the demultiplexer includes a plurality of outputs each coupled to a respective one of the plurality of decoders; and
coupling, based on the control signal, the data signal to one of the plurality of outputs of the demultiplexer that is coupled to the selected one of the plurality of decoders.

10. The method of claim 1, wherein a first of the plurality of decoders shares decoding circuitry with a second of the plurality of decoders.

11. A system comprising:
a plurality of decoders, wherein each of the plurality of decoders is configured to decode information based on a different decoding technique; and
control circuitry configured to:
receive a data signal that includes a codeword;
compute a signal quality indicator for the data signal;
select, one of the plurality of decoders based on the computed signal quality indicator; and
decode the codeword included in the data signal using the selected one of the plurality of decoders.

12. The system of claim 11, wherein the signal quality indicator is a syndrome weight of: the received codeword.

13. The system of claim 11, wherein the computed signal quality indicator represents a signal to noise ratio (SNP) of the data signal or raw it error rate.

14. The system of claim 11, wherein the control circuitry is further configured to:
determine whether a value of the signal quality indicator exceeds a predetermined threshold; wherein:
the one of the plurality of decoders that is selected is a first of the plurality of decoders when the value is determined to exceed the predetermined threshold; and
the one of the plurality of decoders that is selected is a second of the plurality of decoders when the value is determined to be equal or less than the predetermined threshold.

15. The system of claim 11, wherein the control circuitry is further configured to
determine whether the codeword was decoded successfully with the selected one of the plurality of decoders;
select a second one of the plurality of decoders different from the selected one of the plurality of decoders when the codeword is determined to not have been decoded with the selected one of the plurality of decoders; and
decode the codeword included in the data signal using the selected second one of the plurality of decoders.

16. The system of claim 11, wherein a first of the plurality of decoders is configured to decode information using a number of iterations less than a second of the plurality of decoders.

17. The system of claim 11, wherein the signal quality indicator is computed based on a number of errors in a pilot signal corresponding to the codeword.

18. The system of claim 11, wherein the signal quality indicator is computed based on a number of program erase cycles performed in an electronic storage device in which the codeword is stored or the time passed since the data signal has been programmed in the electronic storage device.

19. The system of claim 11 further comprising:
a demultiplexer that includes a plurality of outputs each coupled to a respective one of the plurality of decoders, wherein the demultiplexer is configured to receive the data signal that includes the codeword and a control signal; and
couple, based on the control signal, the data signal to one of the plurality of outputs of the demultiplexer that is coupled to the selected one of the plurality of decoders.

20. The system of claim 11, wherein a first of the plurality of decoders shares decoding circuitry with a second of the plurality of decoders.

* * * * *